(12) United States Patent
Rahim et al.

(10) Patent No.: US 8,081,502 B1
(45) Date of Patent: Dec. 20, 2011

(54) MEMORY ELEMENTS WITH BODY BIAS CONTROL

(75) Inventors: Irfan Rahim, Milpitas, CA (US); Jun Liu, Santa Clara, CA (US); Andy L. Lee, San Jose, CA (US); William Bradley Vest, San Jose, CA (US); Lu Zhou, Santa Clara, CA (US); Qi Xiang, San Jose, CA (US); Yanzhong Yu, Santa Clara, CA (US); Jeffrey Xiaoqi Tung, Milpitas, CA (US); Albert Ratnakumar, San Jose, CA (US)

(73) Assignee: Altera Corporation, San Jose, CA (US)

( * ) Notice: Subject to any disclaimer, the term of this patent is extended or adjusted under 35 U.S.C. 154(b) by 155 days.

(21) Appl. No.: 12/345,560

(22) Filed: Dec. 29, 2008

(51) Int. Cl.
 *G11C 11/00* (2006.01)
(52) U.S. Cl. ............... 365/154; 365/190; 365/189.09
(58) Field of Classification Search ............ 365/154, 365/156, 72, 190, 189.09
See application file for complete search history.

(56) References Cited

U.S. PATENT DOCUMENTS

| | | | |
|---|---|---|---|
| 6,492,233 B2 | 12/2002 | Forbes et al. | |
| 6,943,083 B2 | 9/2005 | Forbes | |
| 7,508,697 B1 * | 3/2009 | Mukhopadhyay et al. | ... 365/154 |
| 7,596,013 B2 * | 9/2009 | Yamaoka et al. | ............. 365/154 |
| 7,742,325 B2 * | 6/2010 | Voelkel | ............ 365/154 |
| 2007/0047364 A1 | 3/2007 | Chuang et al. | |
| 2007/0076467 A1 * | 4/2007 | Yamaoka et al. | ............. 365/154 |
| 2007/0205824 A1 | 9/2007 | Perisetty | |

* cited by examiner

*Primary Examiner* — Amir Zarabian
*Assistant Examiner* — Kretelia Graham
(74) *Attorney, Agent, or Firm* — Treyz Law Group; G. Victor Treyz; Nancy Y. Ru

(57) ABSTRACT

An integrated circuit with memory elements is provided. The memory elements may have memory element transistors with body terminals. Body bias control circuitry may supply body bias voltages that strengthen or weaken memory element transistors to improve read and write margins. The body bias control circuitry may dynamically control body bias voltages so that time-varying body bias voltages are supplied to memory element transistors. Address transistors and latch transistors in the memory elements may be selectively strengthened and weakened. Process variations may be compensated by weakening fast transistors and strengthening slow transistors with body bias adjustments.

16 Claims, 8 Drawing Sheets

MEMORY ELEMENTS WITH BODY BIAS CONTROL

BACKGROUND

This invention relates to volatile memory elements for integrated circuits and, more particularly, to volatile memory elements with transistor body biases that are controlled during operation.

Integrated circuits such as programmable logic devices may contain volatile memory elements in the form of static random access memory (SRAM) cells. In programmable logic device integrated circuits, SRAM cells may serve as configuration random access memory (CRAM) cells. Programmable logic devices are a type of integrated circuit that can be programmed by a user to implement a desired custom logic function. CRAM cells are used to store configuration data supplied by the user. Once loaded, CRAM cells supply control signals to transistors to configure the transistors to implement the desired logic function.

Volatile memory elements such as SRAM and CRAM cells are typically based on cross-coupled inverters (latches). In each memory element, the cross-coupled inverters may be connected to an address transistor that is turned on when data is being read from or written into the memory element. When no data is being read from or written into the memory element, the address transistor is turned off to isolate the memory element. Cross-coupled inverters and address transistors can be formed from complementary metal-oxide-semiconductor (CMOS) transistors such as n-channel metal-oxide-semiconductor (NMOS) and p-channel metal-oxide-semiconductor (PMOS) transistors.

As semiconductor technology scales towards smaller sizes, lower power supply voltages may be used to power integrated circuits. Lower power supply voltages and smaller devices may lead to decreased read and write margins for volatile memory elements. This can pose challenges for reliable device operation.

It would therefore be desirable to be able to provide volatile memory cells that demonstrate improved read and write margins.

SUMMARY

In accordance with embodiments of the present invention, integrated circuits are provided that have body bias control circuitry. The body bias control circuitry may be used to supply body bias voltages to memory element transistors. The body bias voltages can be adjusted to facilitate read and write operations.

Memory elements are provided that are formed from cross-coupled inverters. The cross-coupled inverters may be formed from complementary metal-oxide-semiconductor (CMOS) transistors such as n-channel metal-oxide-semiconductor (NMOS) and p-channel metal-oxide-semiconductor (PMOS) transistors. These NMOS transistors and PMOS transistors may have body terminals that receive body bias voltages. Address transistors may be connected to the cross-coupled inverters. The address transistors may be turned on when data is being written into or read from the memory elements. The address transistors may be NMOS transistors that receive adjustable body bias voltages.

Body bias control circuitry is provided that provides customizable body bias voltages to the body terminals of NMOS and PMOS transistors that form the memory cells. The body bias control circuitry may reverse bias or forward bias select NMOS and PMOS transistors in order to improve read and write margins of memory elements. The body bias control circuitry may dynamically control body bias voltages to provide different body biases to NMOS and PMOS transistors of different memory cells depending on whether the operation being performing is reading or writing, or if writing, whether writing a logic value one or a logic value zero.

Further features of the invention, its nature, and various advantages will be more apparent from the accompanying drawings and the following detailed description.

DETAILED DESCRIPTION

The present invention relates to integrated circuit memory elements, and to body bias control circuitry for supplying customized body bias voltages to memory elements transistors.

Memory elements containing transistors with adjustable body biases may be used for any suitable integrated circuit. The integrated circuits may be memory chips, digital signal processing circuits with memory arrays, microprocessors, application specific integrated circuits with memory arrays, programmable logic device integrated circuits in which memory elements are used for configuration memory, or any other suitable integrated circuit. For clarity, the present invention will generally be described in the context of programmable logic device integrated circuits.

Figure 1:
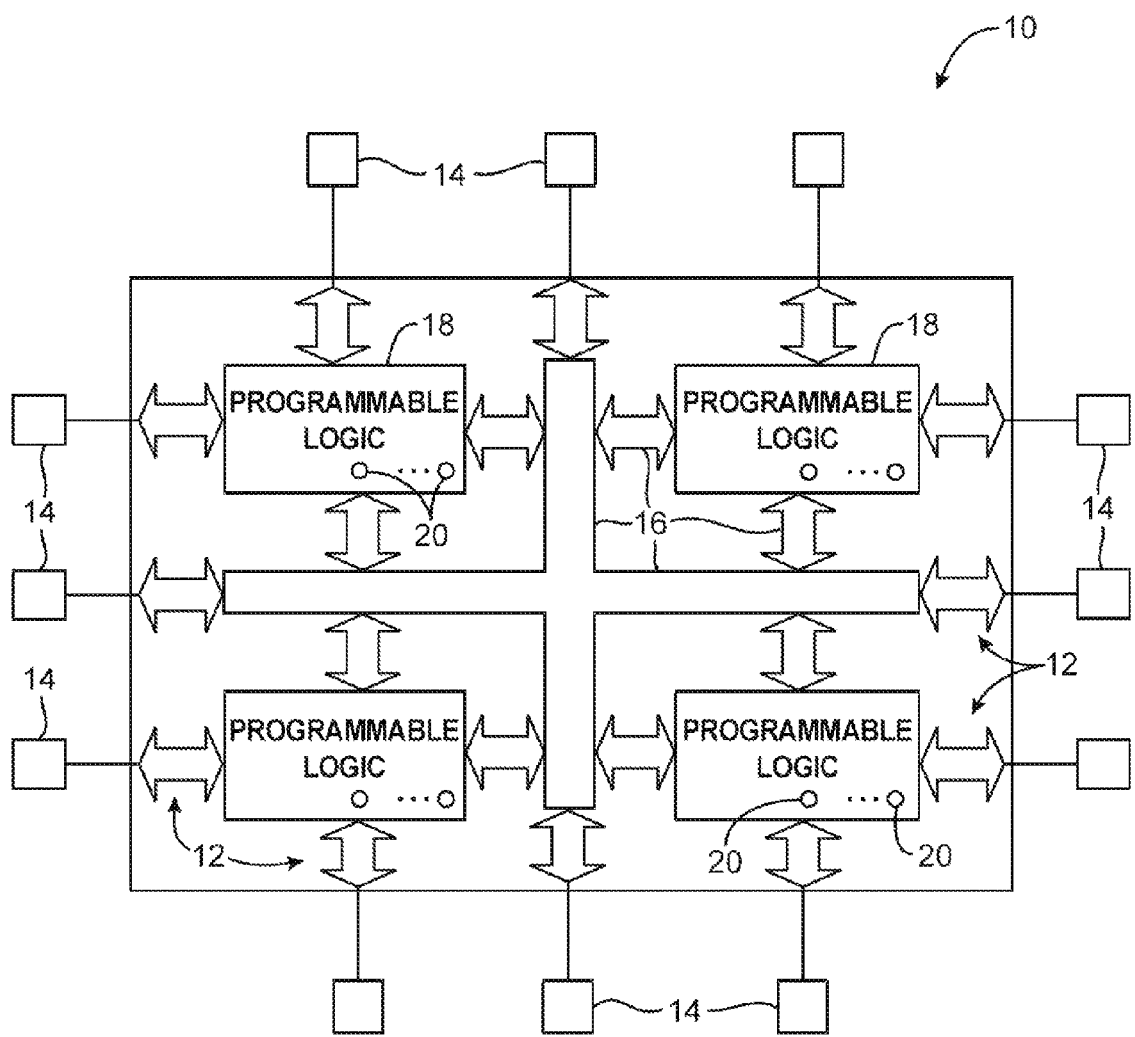
FIG. 1 is a diagram of an illustrative programmable logic device integrated circuit in accordance with an embodiment of the present invention.

An illustrative programmable logic device 10 in accordance with an embodiment of the present invention is shown in FIG. 1. The circuitry of device 10 may be organized using any suitable architecture. As an example, the logic of programmable logic device 10 may be organized in a series of rows and columns of larger programmable logic regions each of which contains multiple smaller logic regions. Programmable logic device 10 may have input/output circuitry 12 for driving signals off of device 10 and for receiving signals from other devices via input/output pins 14. Interconnection resources 16 such as global and local vertical and horizontal conductive lines and busses may be used to route signals on device 10. Interconnection resources 16 include fixed interconnects (conductive lines) and programmable interconnects (i.e., programmable connections between respective fixed interconnects). Programmable logic 18 may include combinational and sequential logic circuitry. The programmable logic 18 may be configured to perform a custom logic function. The programmable interconnects associated with interconnection resources may be considered to be a part of programmable logic 18.

Programmable logic device 10 contains volatile memory elements 20 (also known as memory cells 20) that can be loaded with configuration data (also called programming data) using pins 14 and input/output circuitry 12. In the context of programmable logic device integrated circuits, the memory elements store configuration data and are therefore sometimes referred to as configuration random-access memory (CRAM) cells. Once loaded, the memory elements each provide a corresponding static control output signal that controls the state of an associated logic component in programmable logic 18. Typically the memory element output signals are used to control the gates of metal-oxide-semiconductor (MOS) transistors. Most of these transistors are generally n-channel metal-oxide-semiconductor (NMOS) pass transistors in programmable components such as multiplexers. When a memory element output is high, the pass transistor controlled by that memory element is turned on and passes logic signals from its input to its output. When the memory element output is low, the pass transistor is turned off and does not pass logic signals.

Figure 2:
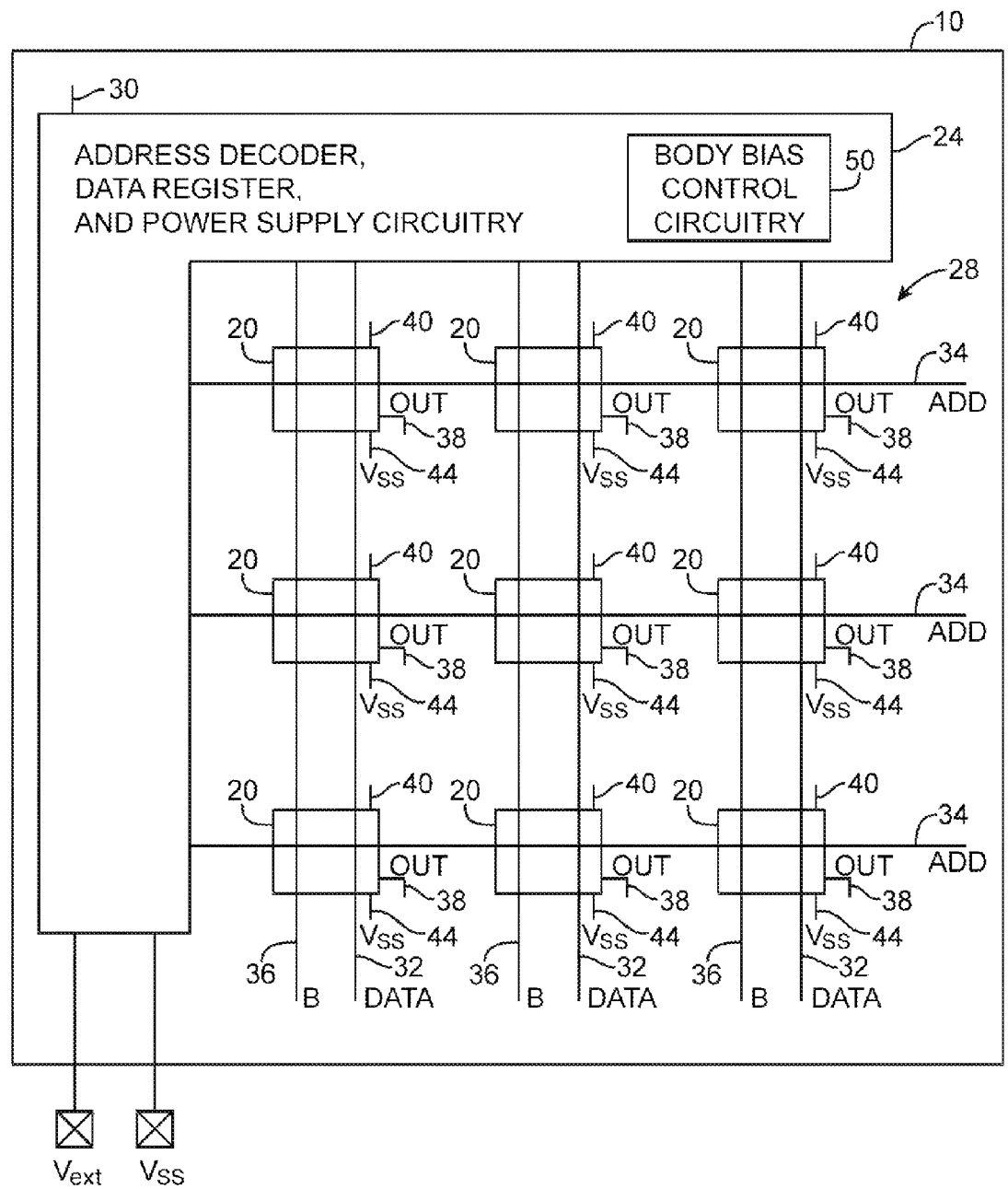
FIG. 2 is a diagram of an array of programmable logic device memory elements in accordance with an embodiment of the present invention.

An architecture that may be suitable for arranging memory elements 20 in programmable logic device 10 is shown in FIG. 2. Array 28 may include rows and columns of memory cells 20. In the example of FIG. 2, there are three rows and three columns of memory elements 20 in array 28. This is merely illustrative. Integrated circuits such as integrated circuit 10 may have any suitable number of memory elements 20. A typical memory array might, as an example, have thousands or millions of memory elements 20 arranged in hundreds or thousands of rows and columns.

Circuitry 24 may control data loading (data writing) operations for array 28. Circuitry 24 may receive data such as configuration data from external sources via input path 30. Configuration data may be loaded into registers in circuitry 24 in series. These registers may then apply the configuration data to array 28 over paths 32. In differential schemes, each column of memory elements 20 has an associated pair of lines 32, which carry a true data signal D and its complement ND. In single-line scenarios, data D is conveyed over a single line 32 in each column.

Address decoder circuits in circuitry 24 may receive external control signals or addressing control signals can be generated internally in circuitry 24. The address decoder circuitry can then systematically assert desired address lines 34. Address lines 34 carry address signals ADD and are typically controlled independently in each row. As an address line 34 is asserted (i.e., as the signal ADD in a given row is taken high), the data on the data lines 32 is loaded into the memory elements 20 in that row. By addressing each row in this way, the entire array 28 may be loaded with configuration data.

Data reading operations for array 28 may be performed by systematically asserting desired address lines and monitoring the resulting data on data lines 32 (e.g., using sense amplifier circuitry in circuitry 24).

During normal operation, when memory cells 20 are neither being written to or read from, the output 38 of each memory element 20 may produce a corresponding static control signal OUT for controlling the gate of a transistor or other component in programmable logic 18 (see, e.g., FIG. 1) of the programmable logic device 10.

Circuitry 24 may contain power supply circuitry that receives one or more power supply voltages such as Vext and Vss. (Positive power supply voltages such as Vext may be, e.g., 0.9 volts, 1.2 volts, 1.5 volts, 2.5 volts, etc. Ground power supply voltages such as Vss may be 0 volts, etc.) Circuitry 24 may produce one or more internal power supply voltages. Internal power supply voltages may be used to power address decoder and data register circuitry in circuitry 24 or to supply power to body bias control circuitry 50. Internal power supply voltages also may be used to power memory elements 20 in array 28. Paths 40 may be used to convey one or more positive power supply voltages to memory cells 20 and paths 44 may be used to convey a ground power supply voltage to memory cells 20.

If desired, power supply circuitry in circuitry 24 may be used to supply memory cells 20 with power supply signals that have time-varying magnitudes. For example, it may be advantageous to vary the power supply voltage signals to memory cells 20 during write operations to selectively weaken certain memory cell components relative to others, thereby improving write margin.

Other signals may be provided with "overdrive" voltage levels or otherwise adjusted levels that enhance operating margin. As an example of an overdrive scheme that may be used with array 28, consider the situation in which the address signal ADD is selectively provided with an overdrive voltage. With this type of arrangement, the magnitude of a "logic value one" address signal ADD may be varied as a function of time (e.g., from a nominal lower value of 0.9 volts to a higher "overdrive" value of 1.2 volts). Use of an elevated (e.g., 1.2 volt) ADD signal during write operations may help the address transistors to drive data into the memory cells and may therefore improve write margin. Use of a lower (e.g., 0.9 volt) ADD signal during read operations may help ensure that data is driven out of the memory cells successfully.

Circuitry 24 may contain body bias control circuitry 50. Body bias control circuitry 50 may receive internal power supply voltages and may use body bias selection logic to supply appropriate body bias voltages to transistors in memory cells 20. Paths such as paths 36 may be used to provide one or more body bias voltages to the body terminals of n-channel metal-oxide-semiconductor (NMOS) and p-channel metal-oxide-semiconductor (PMOS) transistors in memory cells 20. Forward bias voltages and reverse bias voltages may be applied.

Body bias control circuitry 50 may apply static body bias voltages to select NMOS and PMOS transistors. Body bias control circuitry 50 may also dynamically control body bias voltages to provide time-varying body bias voltages to body terminals of select NMOS and PMOS transistors in memory cells 50. Body bias control circuitry 50 may provide body bias voltages that strengthen or weaken transistors as appropriate to improve read margins during reading operations of memory cells 20. Similarly, body bias control circuitry 50 may provide various body bias voltages to cells 20 to strengthen or weaken transistors as appropriate to improve write margins during data writing operations. If desired, body bias voltages may be adjusted in real time so as to supply different body bias voltages when writing a logic value one or a logic value zero, thereby further improving write margins.

During writing operations, memory cells 20 that correspond to unasserted address lines 34 may be supplied with body bias voltages that help to ensure that these memory cells 20 will remain undisturbed while data is being loaded into memory cells 20 that correspond to an asserted address line 34. Another set of body bias voltages may be supplied during normal operation, when neither reading nor writing operations are being performed.

Figure 3:
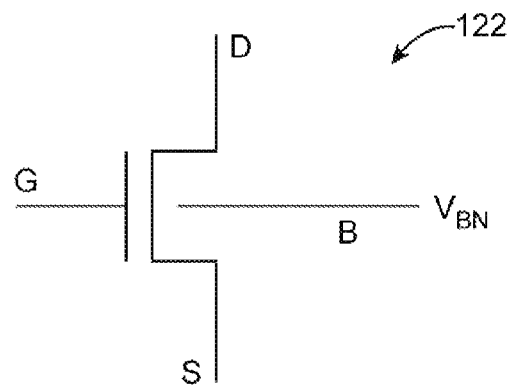
FIG. 3 is a schematic diagram of a body biased n-channel metal-oxide-semiconductor transistor in accordance with an embodiment of the present invention.

Memory elements 20 may be based on cross-coupled inverters (latches) or other circuit elements formed from NMOS and PMOS transistors. A pair of cross-coupled inverters (or other circuit elements) forms a bistable element for each memory cell. A schematic diagram of an illustrative NMOS transistor 122 is shown in FIG. 3. The source of transistor 122 is labeled S, the drain is labeled D, the gate is labeled G, and the body is labeled B. As shown in FIG. 3, a body bias voltage $V_{BN}$ may be applied to body terminal B.

Figure 4:
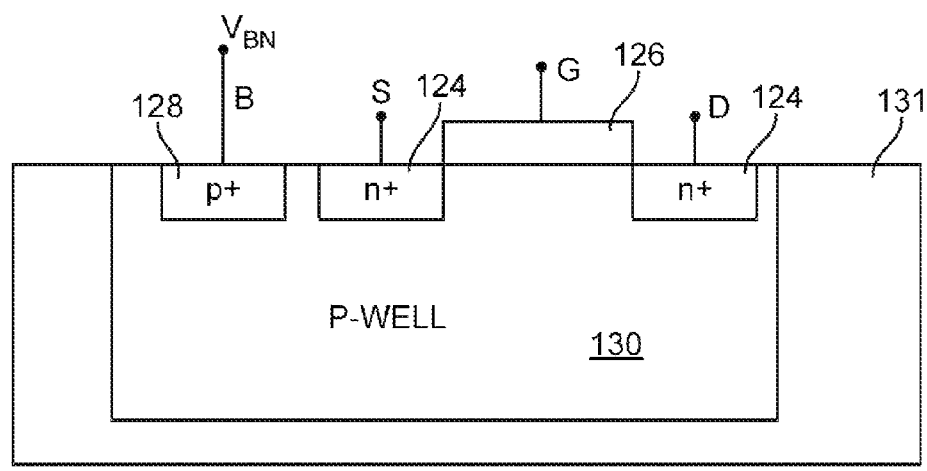
FIG. 4 is a cross-sectional view of a body biased n-channel metal-oxide-semiconductor transistor in accordance with an embodiment of the present invention.

A cross-sectional diagram of the NMOS transistor 122 of FIG. 3 is shown in FIG. 4. Source S and drain D are formed using implant regions 124. Gate structure 126 is formed from a thin layer of insulator such as silicon oxide and a gate conductor such as silicided polysilicon. Body terminal B uses implant region 128 to form an ohmic contact with p-type body region 130 in substrate 131.

The body terminal, which is also sometimes referred to as a well terminal or a bulk terminal, can be biased to alter the effective threshold voltage. In NMOS transistors, the body terminal voltage can be lowered or raised slightly relative to ground voltage Vss. If the body bias voltage $V_{BN}$ is a positive voltage (e.g., if $V_{BN}$ is 0.3 volts), the NMOS transistor is forward biased, lowering the effective threshold voltage of the NMOS transistor. If the body bias voltage $V_{BN}$ is a negative voltage (e.g., if $V_{BN}$ is –0.5 volts), the NMOS transistor is reversed biased, raising the effective threshold voltage of the NMOS transistor.

In PMOS transistors, the body bias voltage can be lowered or elevated slightly with respect to the positive power supply voltage Vcc. If the body bias voltage $V_{BP}$ is smaller than Vcc (e.g., if $V_{BP}$ has a value of Vcc–0.3 volts), the PMOS transistor is forward biased, lowering the effective threshold voltage. If the body bias voltage $V_{BP}$ is greater than Vcc (e.g., if $V_{BP}$ has a value of Vcc+0.5 volts) the PMOS transistor is reverse biased, raising the effective threshold voltage.

When NMOS and PMOS transistors have forward-biased bodies, they are strengthened. This is because a lower threshold voltage leads to a greater source-drain current for given values of Vcc and gate voltage. When NMOS and PMOS transistors have reverse-biased bodies, they are weakened.

Figure 5:
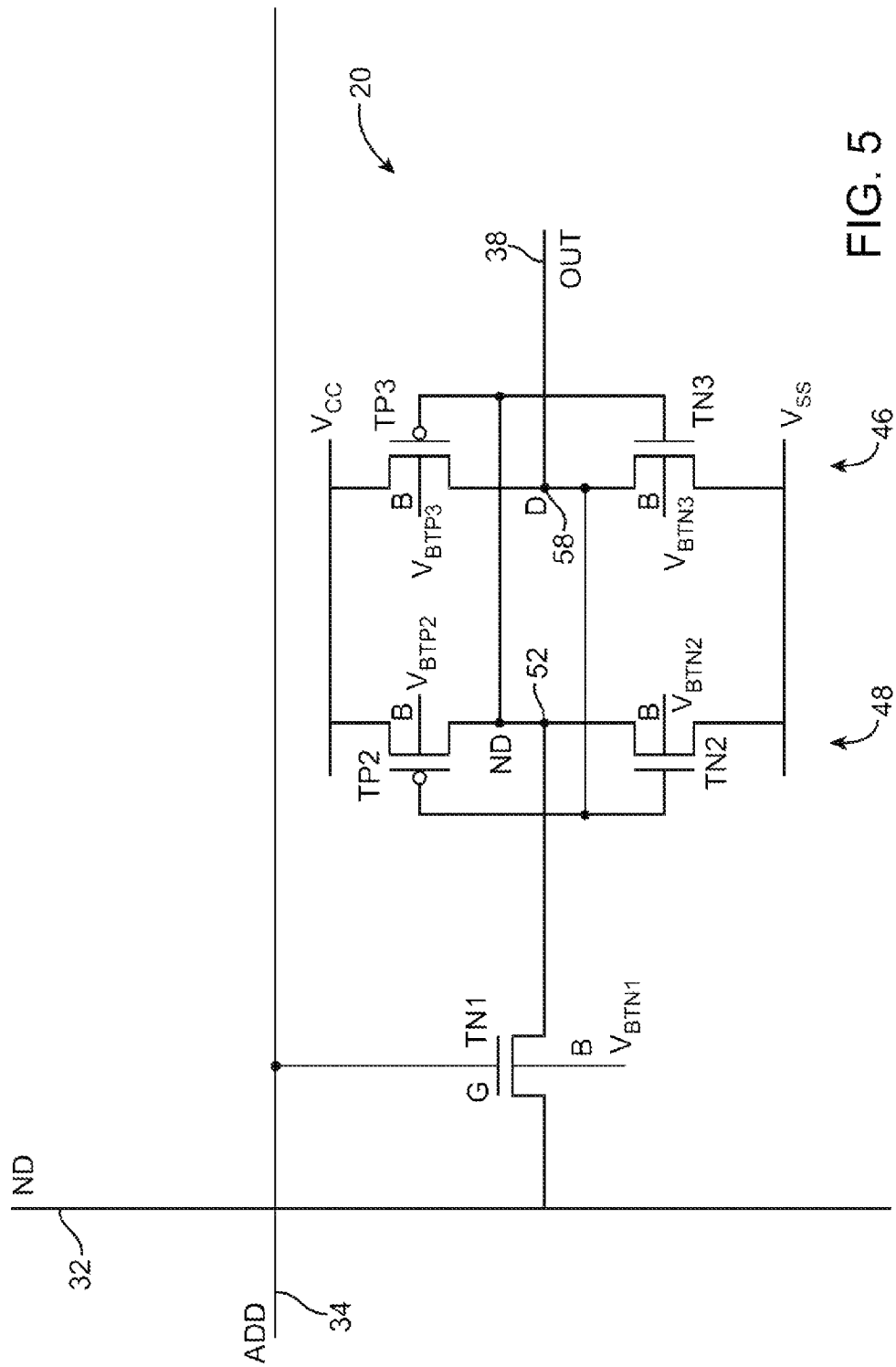
FIG. 5 is a diagram of a programmable logic device memory element containing cross-coupled inverters formed from body-biased transistors in accordance with an embodiment of the present invention.

An illustrative memory cell 20 that is based on two cross-coupled inverters (latches) formed from CMOS transistors is shown in FIG. 5. As shown in FIG. 2, element 20 is based on two cross-coupled inverters 46 and 48. Inverter 46 is formed from PMOS transistor TP3 and NMOS transistor TN3. PMOS transistor TP3 is connected between Vcc and node 58, whereas NMOS transistor TN3 is connected between node 58 and Vss. PMOS transistor TP3 has a body terminal B that receives body bias voltage $V_{BTP3}$. NMOS transistor TN3 has a body terminal B that receives body bias voltage $V_{BTN3}$. Inverter 48 is formed from PMOS transistor TP2 and NMOS transistor TN2. PMOS transistor TP2 is connected between Vcc and node 52 and has a body terminal B that receives body bias voltage $V_{BTP2}$. NMOS transistor TN2 is connected between node 52 and Vss and has a body terminal B that receives body bias voltage $V_{BTN2}$. PMOS transistors TP2 and TP3 are sometimes called "pull-up" transistors while NMOS transistors TN2 and TN3 are sometimes called "pull-down" transistors. Collectively, transistors TN2, TN3, TP2, and TP3 may be referred to as "latch" transistors.

During a writing operation for memory cell 20, memory cell 20 is loaded with configuration data. If the loaded value D of the configuration data is a logic one (i.e., if a low voltage is loaded onto node 52), a high voltage is provided at node 58 and is supplied to output terminal 38. If the loaded value D of the configuration data is a logic zero (i.e., if a high voltage is loaded onto node 52), a low voltage is provided at output terminal 38. The complementary value ND is stored on node 52. The signal on output terminal 38 is applied to programmable logic 18 (see, e.g., FIG. 1) such as the gate of a transistor.

Address signal ADD is provided on line 34. Data signals are conveyed on line 32. In the configuration shown in FIG. 6, complementary data signals ND are conveyed on line 32. An NMOS address transistor TN1, also known as a pass transistor or address transistor, may be connected between data line 32 and node 52. Address signal ADD is applied to the gate of address transistor TN1. When it is desired to write a data bit into memory cell 20, address signal ADD on line 34 is asserted. Address signal ADD turns on address transistor TN1, connecting node 52 to data line 32. This drives the data signal DATA on line 32 onto node 52. When the write operation is completed, address line 34 may be deasserted, turning address transistor TN1 off and isolating cell 20 from further changes.

Data may be read from memory cell 20 (e.g., for testing). During a read operation, data line 32 may be precharged using precharge circuitry. Following precharge operations, address signal ADD on line 34 is asserted, connecting node 52 to data line 32. The logic value stored on node 52 may then be sensed by sense amplifier circuitry that is connected to data line 32. When the read operation is completed, address line 34 may be deasserted, turning address transistor TN1 off and isolating cell 20.

Address transistor TN1 may have a body terminal B that receives body bias voltage $V_{BTN1}$ from body bias control circuitry 50 in FIG. 1. It may be desirable to strengthen address transistor TN1 during a writing operation to improve write margins and weaken address transistor TN1 during a reading operation to improve read margins. This may be accomplished using body bias control circuitry. In particular, body bias control circuitry 50 may dynamically control body bias voltage $V_{BTN1}$ so that address transistor TN1 is forward biased during a writing operation and reverse biased during a reading operation.

Body biasing may be used in conjunction with transistor sizing to improve read and write margins. For example, address transistor TN1 may be designed to be a relatively small and weak transistor in order to improve read margins. To ensure write margins for this type of small address transistor are satisfactory, dynamic body biasing may be used to forward bias and therefore strengthen address transistor TN1 during writing operations.

Body bias voltages may also be used to strengthen or weaken some or all of the latch transistors TN2, TN3, TP2, and TP3, to improve read and write margins. The body bias voltages may have static values or body bias voltages may be dynamically controlled to have different values for reading, writing, and normal operation. Body bias voltages may also be controlled so that they have different values when writing a logic value one than when writing a logic value zero into memory cell 20.

When writing a logic value one into memory cell 20, complementary data signal ND is held low and node 52 is driven low through address transistor TN1 when ADD is asserted. If memory cell 20 was previously storing a logic value zero, node 52 must be pulled low, so that the value on node 58 switches from low to high. The previous "logic value zero" states for the latch transistors in cell 20 would have been "on" for TP2, "off" for TN2, "off" for TP3, and "on" for TN3. The desired states for the latch transistors would be the opposite: "off" for TP2, "on" for TN2, "on" for TP3, and "off" for TN3. The relative strengths of latch transistors TN2, TN3, TP2, and TP3 may be adjusted via body biasing in order to improve the switching performance memory cell 20 from logic value zero to logic value one.

Adjusting the strength of latch transistor TP2 relative to transistor TN1 is helpful when writing a logic one into cell 20. The strength of TP2 may have more of an impact on switching performance than adjusting the relative strengths of the other latch transistors TN3, TP2, and TP3. Transistors TP3 and TN3 have data signal ND applied directly their gates, so TP3 and TN3 are likely to be easily switched from their previous states. Transistor TN2, being in an off state, would not strongly resist a logic value zero on node 52. However, if the previous value of node 52 was a logic value one, PMOS transistor TP2 would have been in an on state, and connecting node 52 directly to Vcc. In order for the switching to a low value on node 52 to be successful, the signal from address transistor TN1 needs to overcome the previous high value stored on node 52 that was being maintained by transistor TP2.

PMOS transistor TP2 may therefore be provided with a reverse body bias voltage $V_{BTP2}$. Such a reverse body bias voltage $V_{BTP2}$ weakens PMOS transistor TP2 and helps TN1 drive node 52 low, thereby turning off TP2. If desired, the relative strengths of latch transistors TN3, TN2, and TP3 may also be adjusted. NMOS transistor TN2 and PMOS transistor TP3 may be forward biased to enable them to turn on more readily. NMOS transistor TN3 may be reverse biased to enable it to turn off more readily.

When writing a logic value zero into memory cell 20, complementary data signal ND is held high and node 52 is driven high through address transistor TN1 when ADD is asserted. If memory cell 20 was previously storing a logic value one, node 52 must be pulled high so that the value on node 58 switches from high to low. The relative strengths of the latch transistors in cell 20 may be adjusted to facilitate switching. In particular, it may be beneficial to adjust the strength of transistor TN2, which was previously in an "on" state and was connecting node 52 to ground. Transistor TN2 may be reversed biased and weakened to help TN1 drive node 52 high, thereby turning TN2 off more readily. If desired, the relative strengths of latch transistors TP2, TN3, and TP3 may also be adjusted. Transistor TP3 may be reverse biased to enable it to turn off more readily as node 52 goes high. Transistors TN3 and TP2 may be forward biased to enable them to turn on more readily as node 58 goes low and node 52 goes high.

When a writing operation is complete, the body bias voltages of latch transistors TN2, TN3, TP2, and TP3 may remain at their most recent strength settings, or body bias voltages $V_{BTN2}$, $V_{BTN3}$, $V_{BTP2}$, and $V_{BTP3}$ may be adjusted so that the strengths of TN2, TN3, TP2, and TP3 are more suitable for normal operation of memory cell 20 (e.g., to minimize power consumption).

When a reading operation is performed on memory cell 20, the body bias voltages of latch transistors TN2, TN3, TP2, and TP3 may be left at their most recent strength settings, or some or all of the latch transistors (e.g., transistors TP2 and TP3) may be forward biased and strengthened.

Body bias voltages that are desirable for address transistor TN1 and latch transistors TN2, TN3, TP2, and TP3 for improving write margins during a writing operation may sometimes be referred to as "write strength settings" for memory cell 20. Likewise, body bias voltages that are desirable for improving read margins for address transistor TN1 and latch transistors TN2, TN3, TP2, and TP3 during a reading operation may sometimes be referred to as "read strength settings."

When data is being loaded into memory array 28 (see, e.g., FIG. 2), address lines 34 are typically asserted row by row. It may be desirable for memory elements 20 that correspond to unasserted address lines 34, to remain undisturbed by writing operations that may be occurring in memory elements 20 of adjacent rows of memory array 28. Body bias voltages may be provided to address transistor TN1 and latch transistors TN2, TN3, TP2, and TP3 of these undisturbed memory cells 20 that are similar to or identical to those for a read strength setting. Address transistor TN1 in each memory cell in the adjacent rows may, for example, be reverse biased and latch transistors TN2, TN3, TP2, and TP3 may be forward biased or left at their more recent strength settings. The strength settings for these undisturbed memory elements 20 may sometimes be referred to as "write disturb" strength settings.

Body bias control circuitry 50 (FIG. 2) may contain logic circuitry that sets appropriate body bias voltages for address transistor TN1 and latch transistors TN2, TN3, TP2, and TP3 in each memory cell 20. Body bias voltages may be provided to memory cells 20 along paths 36 in FIG. 1. These body bias adjustments may be made dynamically in real time during operation.

At a given time, different memory elements 20 in array 28 may be provided with different strength settings. This may be desirable in situations such as when configuration data is being loaded and some memory elements 20 are associated with asserted address lines 34 while other memory elements 20 are associated with unasserted (deasserted) address lines 34. During a data loading operation, some memory cells 20 may be loading a logic value one, and other memory cells 20 may be loading a logic value zero. If desired, body bias control circuitry 50 may ensure that transistor strengths appropriate for loading a logic value one may be provided to memory cells 20 during loading of a logic value one, and transistor strengths appropriate for logic value zero may be provided to memory cells 20 during a loading of a logic value zero. This type of data-dependent control of body biases is optional. If desired, other adjustment schemes may be used. For example, cells 20 can be provided with one set of body biases during writes and another set of body biases during reads, etc.

Figure 6:
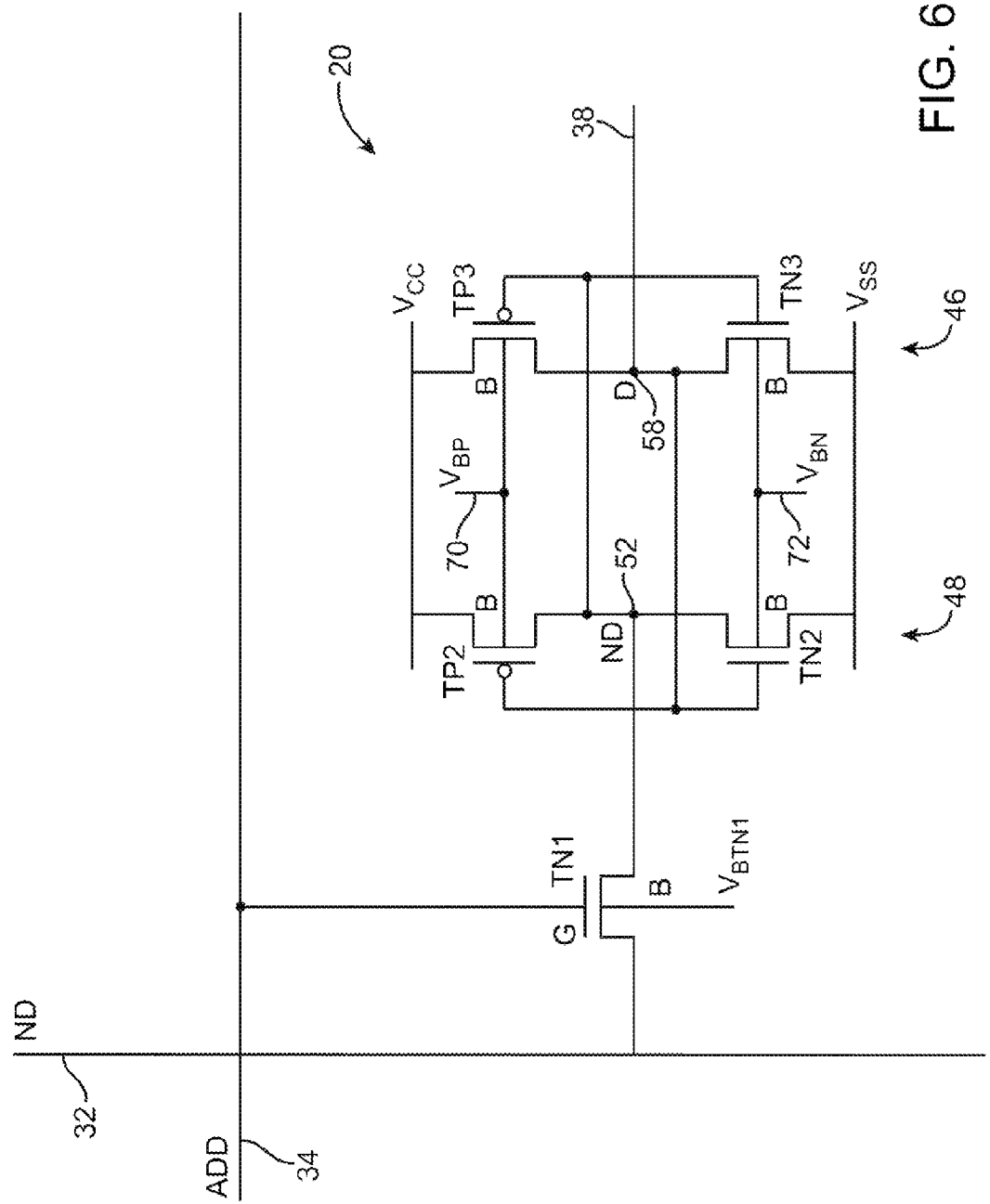
FIG. 6 is a diagram of a programmable logic device memory element containing cross-coupled inverters formed from body-biased transistors, in which some transistors share a common body bias voltage in accordance with an embodiment of the present invention.

In the configuration of FIG. 5, the body bias voltages for each latch transistor may potentially be independently controlled. In some situations, it may be desirable to have a common body bias voltage provided to NMOS latch transistors TN2 and TN3 and a common body bias voltage provided to PMOS latch transistors TP2 and TP3, as shown in the configuration of FIG. 6. This helps to conserve circuit resources.

In memory cell 20 of FIG. 6, NMOS latch transistors TN2 and TN3 are connected to ground power supply voltage Vss and are supplied with a common body bias voltage $V_{BN}$ on path 72. PMOS latch transistors TP2 and TP3 are connected to positive power supply voltage Vcc and are supplied with a common body bias voltage $V_{BP}$ on path 70. The logic value of memory cell 20 is stored on node 58 and is output on path 38.

Address transistor TN1 is connected between data line 32 and node 52. Address signal ADD on address line 34 is applied to the gate of address transistor TN1. Address transistor TN1 is supplied with body bias voltage $V_{BTN1}$.

The memory cell of FIG. 6 may be controlled using simpler body bias control circuitry 50 than the body bias control circuitry used for the configuration of FIG. 5. The cell configuration of FIG. 6 may also require fewer body bias voltage lines per column of array 28 than the configuration of FIG. 5.

If desired, latch transistors TN2, TN3, TP2, and TP3 may be reverse biased and address transistor TN1 may be forward biased in cell 20 of FIG. 6 during write operations. Latch transistors TN2, TN3, TP2, and TP3 may be forward biased and address transistor TN1 may be reverse biased during read operations.

Figure 7:
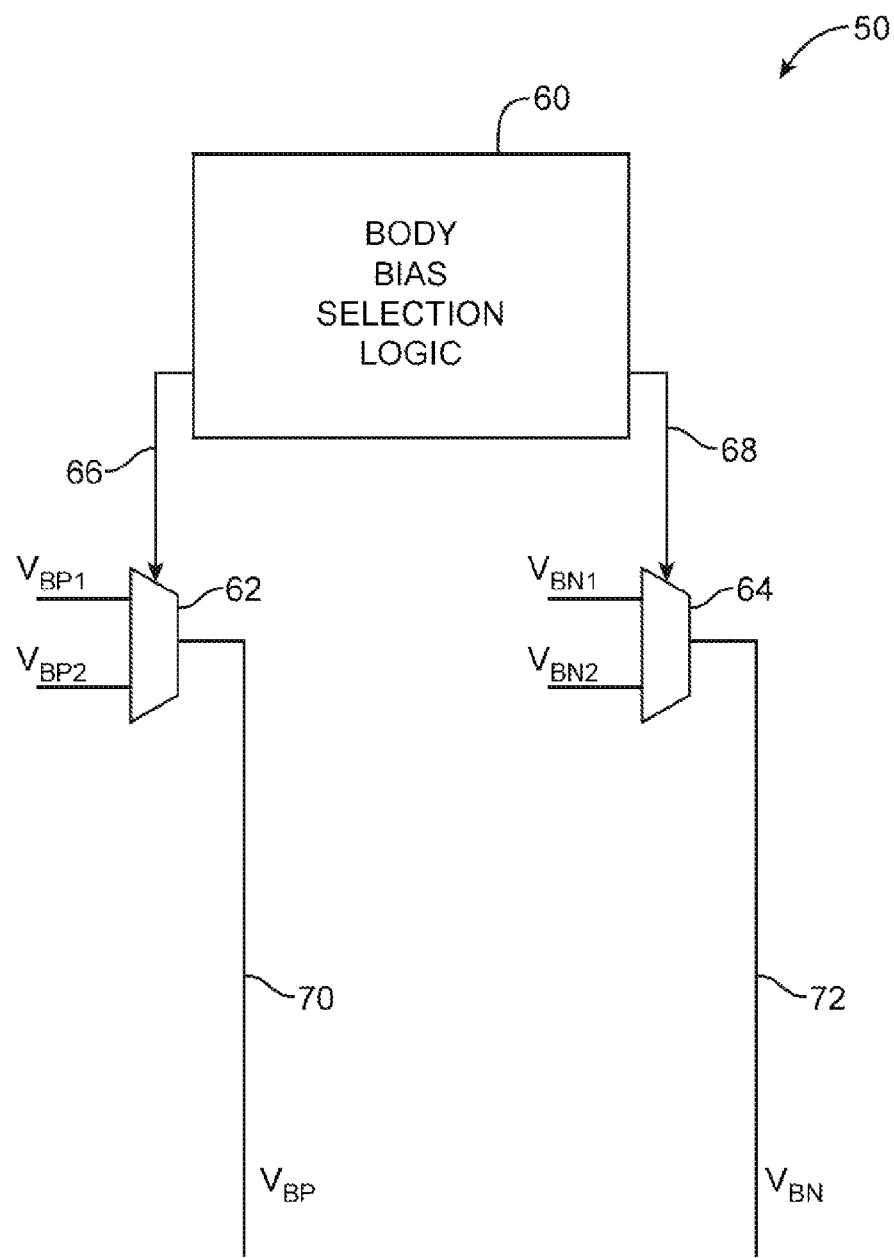
FIG. 7 is a diagram of body bias control circuitry in accordance with an embodiment of the present invention.

Body bias control circuitry 50 suitable for providing body biases $V_{BTN1}$, $V_{BP}$, and $V_{BN}$ of FIG. 6 may have the configuration shown in FIG. 7. Body bias control circuitry 60 may have body bias selection logic 60. Body bias selection logic 60 may supply control signals on paths 66 and 68 to corresponding control inputs for multiplexers 62 and 64, respectively. Multiplexer 62 may have two inputs on which PMOS body bias voltages $V_{BP1}$ and $V_{BP2}$ are received. Multiplexer 62 may output either $V_{BP1}$ or $V_{BP2}$ as PMOS body bias voltage $V_{BP}$ on path 70. Multiplexer 64 may have two inputs on which NMOS body bias voltages $V_{BN1}$ and $V_{BN2}$ are received. Multiplexer 64 may output NMOS body bias voltage $V_{BN}$ on path 72. PMOS body bias voltages $V_{BP1}$ and $V_{BP2}$ and NMOS body bias voltages $V_{BN1}$ and $V_{BN2}$ may be received from power supply circuitry in circuitry 24 of FIG. 2.

Body bias selection logic 60 may contain hardwired or soft (programmed) logic that determines what body bias voltages to send to memory elements 20. PMOS body bias voltages $V_{BP1}$ and $V_{BP2}$ may be a PMOS reverse body bias voltage and a PMOS forward body bias voltage, respectively. One of $V_{BP1}$ and $V_{BP2}$ may be equal to positive power supply voltage Vcc. NMOS body bias voltages $V_{BN1}$ and $V_{BN2}$ may be an NMOS reverse body bias voltage and an NMOS forward body bias voltage, respectively, or one of $V_{BN1}$ and $V_{BN2}$ may be a ground voltage Vss such as 0 volts.

In some cases, it may be desirable for static body bias voltages to be provided to latch transistors TN2, TN3, TP2, and TP3. With this type of approach, the body bias voltages are constant in time and are the same for reading, writing, and normal operations. For example, a fixed body bias voltage of Vcc for PMOS transistors TP2 and TP3 and Vss for NMOS transistors TN2 and TN3 may be used. In another example, fixed reverse body bias voltages may be provided to all latch transistors TN2, TN3, TP2, and TP3. This may improve write margin for memory cell 20 without significantly decreasing read margin. The use of static body bias voltages on latch transistors may help increase switching speed and allow for simplified body bias control circuitry 50. In this type of configuration, address transistor TN1 may be the only transistor in memory cell 20 that is provided with a dynamically controlled body bias voltage. This may allow the address transistor TN1 to be made smaller and weaker than would otherwise be possible in order to increase read margins. A dynamically controlled body bias voltage that applies a forward bias to strengthen address transistor TN1 during write operations may be used to compensate for the inherent weakness of the small TN1. When the write operation is complete, address transistor TN1 may be supplied with a reverse bias or other body voltage to increase read margin.

The body bias voltage settings and transistor strength settings that have been described in connection with FIGS. 1-7 as suitable for reading, writing, and normal operation of memory cell 20 are merely examples. Other fixed and dynamic memory cell body bias voltage settings may be used for optimizing read margins, write margins, speed, or other aspects of a given integrated circuit, if desired.

Figure 8:
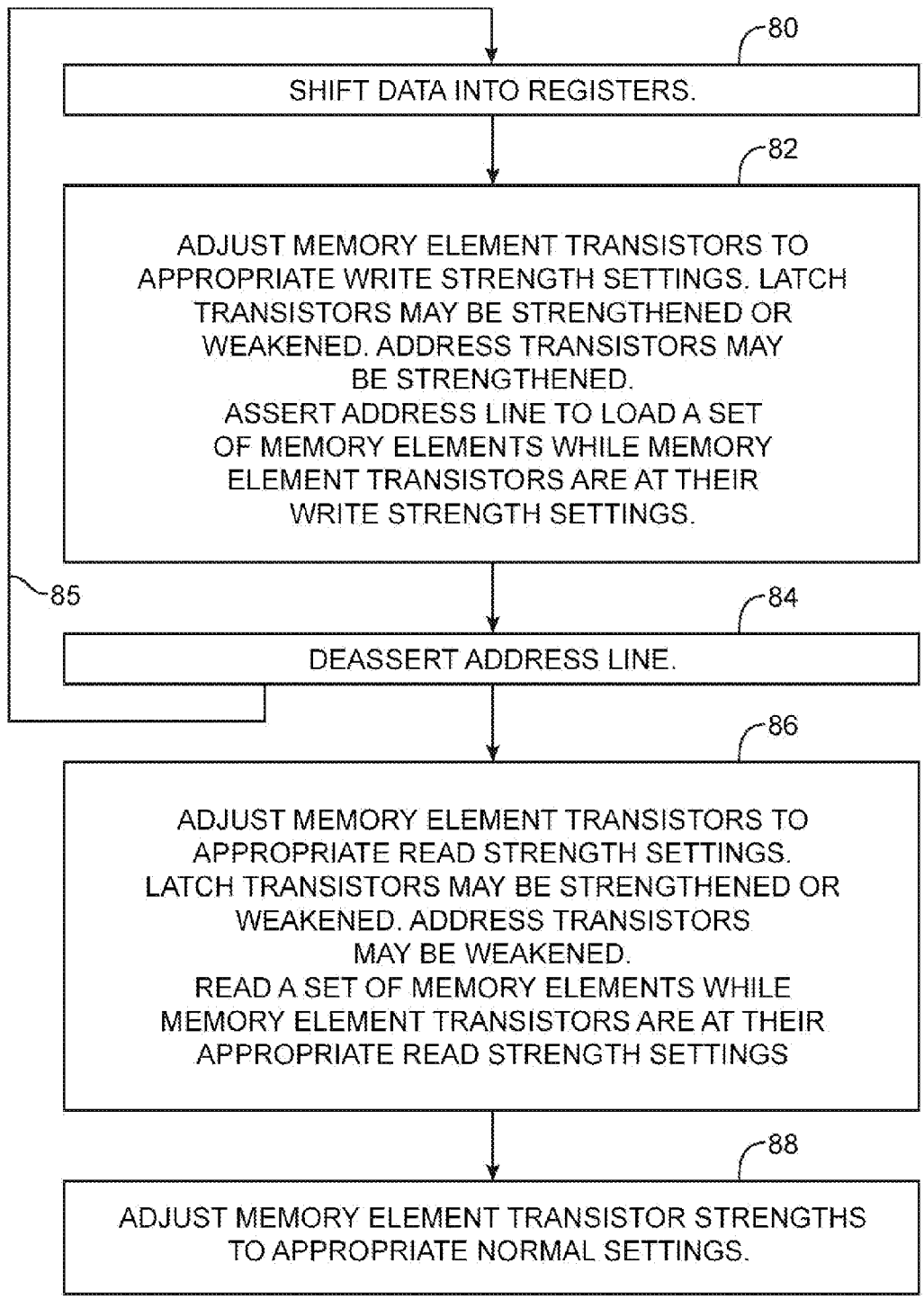
FIG. 8 is a flowchart showing how body bias voltages for memory element transistors may be dynamically adjusted during read and write operations in accordance with an embodiment of the present invention.

FIG. 8 is a flowchart showing how adjustable body bias voltages may be used during reading and writing operations of memory cells 20 when memory cell 20 is used in an integrated circuit such as a programmable logic device (as an example). As indicated by step 80, configuration data for configuring programmable logic on the programmable logic device may be shifted into registers located in circuit 24 of FIG. 2.

Body bias voltages for transistors in memory cells 20 may then be adjusted to their appropriate write strength settings, as indicated in step 82. In step 82, address transistors TN1 may be strengthened (see, e.g., FIG. 5) and latch transistors TN2, TN3, TP2, and TP3 of FIG. 5 may be strengthened or weakened. Address lines may be asserted to load a set of memory elements 20 while transistors in those memory elements 20 are provided with body biases at their write strength settings.

Write strength settings may be adjusted during the data loading process. For example, write strength settings may be different for those memory cells 20 loading a logic value one than for those memory cells loading a logic value zero. After data loading is completed for a set of memory elements 20, address lines 34 are deasserted, as indicated by box 84, and body biases for the set of memory elements 20 may be controlled to have settings appropriate for reading or may be provided with "write disturb" body bias settings. Steps 80, 82, and 84 may be repeated for successive address lines and successive sets of memory elements until all configuration data has been loaded, as indicated by line 85.

Data may be read from memory elements 20, as indicated by box 86. During read operations, transistors in memory elements 20 may be provided with body biases at appropriate read strength settings. The body biases associated with the read strength settings may weaken the address transistor TN1 of FIG. 5. Read strength body biases may also strengthen latch transistors TN2, TN3, TP2, and TP3 of FIG. 5. The data in memory elements 20 may be read while the memory cell transistors are body biased at their appropriate read strength settings. After reading operations are complete, transistors in memory elements 20 may be supplied with body biases at strength settings appropriate for normal operation.

Due to process variations, some transistors that are designed to be uniform on device 10 may actually differ slightly in strength. Body bias control circuitry 50 may used to provide body bias voltages that compensate for these variations. For example, as indicated in box 90 of FIG. 9, transistors in a fabricated circuit may be characterized as fast, slow, or typical. Test equipment may be used to make these characterizing measurements.

Figure 9:
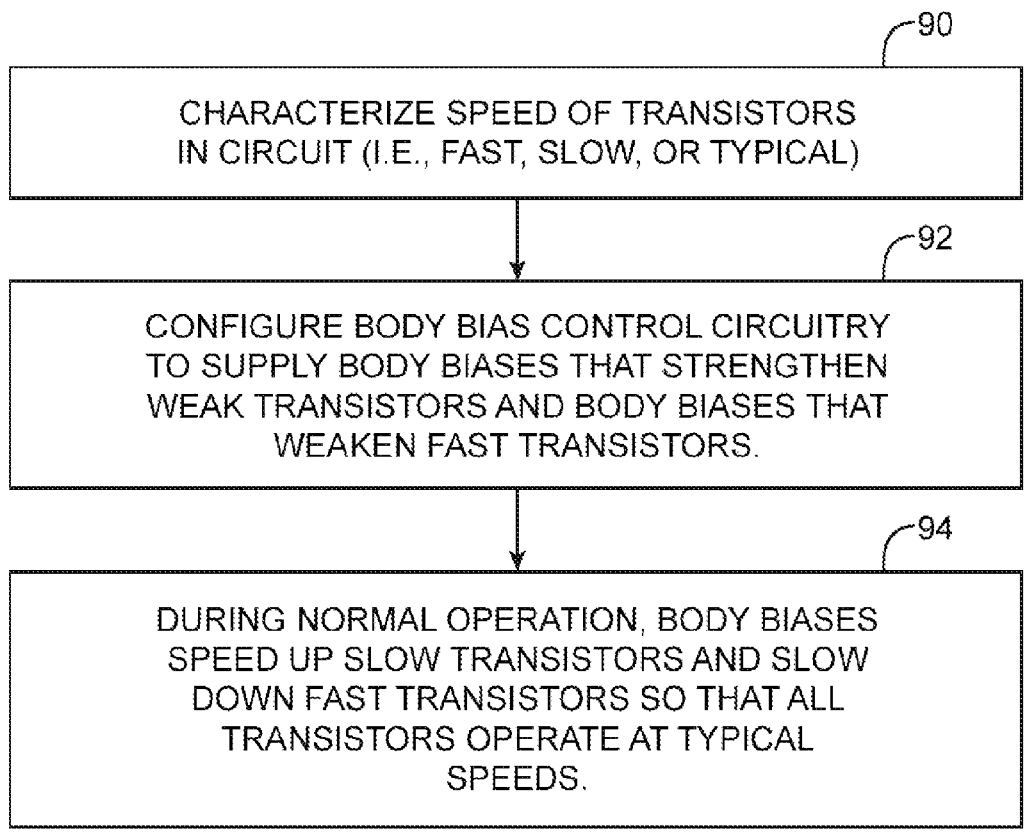
FIG. 9 is a flowchart showing how body bias voltages for memory element transistors may be adjusted to compensate for process variations in transistors in accordance with an embodiment of the present invention.

Body bias control circuitry may then be configured to provide different body bias voltages to transistors of different speed characterizations, as indicated by box 92 of FIG. 9. For example, if a typical NMOS forward bias is 0.3 volt and a typical NMOS reverse bias is −0.5 volts, then a slow NMOS transistor might receive a compensating forward bias of 0.4 volts and a compensating reverse bias of −0.4 volts. These bias voltages may increase the strength of the slow NMOS transistor so that it becomes similar to that of the typical NMOS transistor. A fast NMOS transistor might receive a forward bias of 0.2 volts and a reverse bias of −0.6 volt. These body bias voltages may decrease the strength of the fast NMOS transistor so that it becomes similar to the typical NMOS transistor, as indicated by step 94 of FIG. 9. Compensating body bias settings may be stored on an integrated circuit (e.g., in fuses or other nonvolatile memory) for later retrieval and use. The particular values of body bias voltages described here are merely examples.

Likewise, if a typical PMOS transistor forward bias is Vcc−0.3 volts and a typical PMOS transistor reverse bias is Vcc+0.5 volts, then a slow PMOS transistor might receive a forward bias of Vcc−0.4 volts and a reverse bias of Vcc+0.4 volts. A fast PMOS transistor might receive a forward bias of Vcc−0.2 volts and a reverse bias of Vcc+0.6 volts. These body bias voltages may decrease the strength of the fast PMOS transistor and increase the strength of the slow PMOS transistor so that fast, slow, and typical PMOS transistor run at similar speeds, as indicated by box 94 of FIG. 9. The use of these particular values of body bias voltages to adjust PMOS transistors is merely illustrative.

The use of body bias control circuitry to control the strengths of memory element transistors to improve read margins and write margins may used in conjunction with other strategies for improving read margins and write margins. For example, during a writing operation, power supply circuitry in circuitry 24 may be used to selectively weaken certain memory cell components relative to others by supplying a smaller power supply signal to those memory cell components. In another example, address lines 34 in FIG. 1 may selectively be supplied with an "overdrive" voltage, so that the magnitude of an address ADD signal with logic value one has a higher "overdrive" value.

The foregoing is merely illustrative of the principles of this invention and various modifications can be made by those skilled in the art without departing from the scope and spirit of the invention.

What is claimed is:

1. Circuitry comprising:
   a memory cell comprising:
      an address transistor with a body terminal; and
      first and second cross-coupled inverters, each inverter having an n-channel metal-oxide-semiconductor transistor, a p-channel metal-oxide-semiconductor transistor, and an input, wherein the address transistor is coupled to the input of the first inverter, wherein each of the n-channel metal-oxide-semiconductor transistors has a respective body terminal and wherein each of the p-channel metal-oxide semiconductor transistors has a respective body terminal; and
   body bias control circuitry that is operable to supply a dynamic time-varying body bias voltage to the body terminal of the address transistor, wherein the body bias control circuitry is configured to supply body bias voltages to the body terminals of the n-channel metal-oxide-semiconductor transistors, wherein the body bias control circuitry is configured to supply body bias voltages to the body terminals of the p-channel metal-oxide-semiconductor transistors, and wherein the body bias control circuitry is configured to supply a reverse bias to the body bias terminal of the n-channel metal-oxide-semiconductor transistor of the second inverter during write operations into the memory cell.

2. The circuitry defined in claim 1, wherein the body bias control circuitry is configured to supply a forward bias to the body terminal of the address transistor during write operations into the memory cell.

3. The circuitry defined in claim 1, wherein the body bias control circuitry is configured to supply a reverse bias to the body bias terminal of the address transistor during read operations from the memory cell.

4. The integrated circuit defined in claim 1, wherein the body bias control circuitry is configured to dynamically control the body bias voltage supplied to the body terminal of the address transistor, is configured to dynamically control the body bias voltages supplied to the body terminals of the n-channel metal-oxide-semiconductor transistors, and is configured to dynamically control the body bias voltages supplied to the body terminals of the p-channel metal-oxide-semiconductor transistors.

5. The integrated circuit defined in claim 1, wherein the body bias control circuitry is configured to supply a reverse bias to the body bias terminal of the p-channel metal-oxide-semiconductor transistor of the second inverter during write operations into the memory cell.

6. The integrated circuit defined in claim 1, wherein the body bias control circuitry is configured to supply a forward bias to the body terminals of the address transistor, a reverse bias to the body terminals of the re-channel metal-oxide-semiconductor transistors, and a reverse bias to the body terminals of the p-channel metal-oxide-semiconductor during write operations into the memory cell.

7. Circuitry, comprising:
   a memory cell comprising:
      an address transistor with a body terminal; and
      first and second cross-coupled inverters, each inverter having an n-channel metal-oxide-semiconductor transistor, a p-channel metal-oxide-semiconductor transistor, and an input and wherein the address transistor is coupled to the input of the first inverter, wherein each of the n-channel metal-oxide-semiconductor transistors has a respective body terminal, and wherein each of the p-channel metal-oxide semiconductor transistors has a respective body terminal; and
   body bias control circuitry that is operable to supply a dynamic time-varying body bias voltage to the body terminal of the address transistor, is operable to supply dynamic time-varying body bias voltages to the body terminals of the n-channel metal-oxide-semiconductor transistors, and is operable to supply dynamic time-varying body bias voltages to the body terminals of the p-channel metal-oxide-semiconductor transistors, wherein the body bias control circuitry is configured to supply a forward bias to the body terminal of the address transistor, a forward bias to the body terminal of the p-channel metal oxide semiconductor transistor of the first inverter, a reverse bias to the body terminal of the n-channel metal-oxide-semiconductor transistor of the first inverter, a forward bias to the body terminal of the n-channel metal-oxide-semiconductor transistor of the second inverter, and a reverse bias to the body terminal of the p-channel metal-oxide-semiconductor transistor of the second inverter when writing a logic one into the memory cell.

8. The integrated circuit defined in claim 7, wherein the body bias control circuitry is configured to supply a forward bias to the body terminal of the address transistor, a reverse bias to the body terminal of the p-channel metal oxide semiconductor transistor of the first inverter, a forward bias to the body terminal of the n-channel metal-oxide-semiconductor transistor of the first inverter, a reverse bias to the body terminal of the n-channel metal-oxide-semiconductor transistor of the second inverter, and a forward bias to the body terminal of the p-channel metal-oxide-semiconductor transistor of the second inverter when writing a logic zero into the memory cell.

9. Circuitry, comprising:
   a memory cell having an address transistor and having first and second cross-coupled inverters, each inverter having an n-channel metal-oxide-semiconductor transistor and a p-channel metal-oxide-semiconductor transistor, wherein the address transistor has a body terminal and wherein the address transistor is coupled to an input of the first inverter; and body bias control circuitry that is operable to supply a dynamic time-varying body bias voltage to at least one of the transistors in the second inverter, wherein the body bias control circuitry is configured to supply a reverse body bias voltage to the n-channel metal-oxide-semiconductor transistor of the second inverter when writing data into the memory cell.

10. The circuitry defined in claim 9, wherein the body bias control circuitry is configured to supply a forward body bias voltage to at least one of the transistors in the second inverter when reading data from the memory cell.

11. An integrated circuit, comprising:

a memory cell having an address transistor and first and second cross-coupled inverters, each inverter having an input, an output, an n-channel metal-oxide-semiconductor transistor, and a p-channel metal-oxide-semiconductor transistor;

an address line connected to a gate in the address transistor, wherein the address transistor has a terminal coupled to the input of the first inverter and the output of the second inverter; and body bias control circuitry that is operable to supply dynamic time-varying body bias voltages to a body terminal of the address transistor and is operable to supply dynamic time-varying body bias voltages to body terminals in the n-channel metal-oxide-semiconductor transistor and in the p-channel metal-oxide-semiconductor transistor in the second inverter, wherein the dynamic time-varying body bias voltages supplied to the body terminals in the n-channel metal-oxide-semiconductor transistor and in the p-channel metal-oxide-semiconductor transistor in the second inverter are different when writing a logic one into the memory cell than when writing a logic zero into the memory cell.

12. The integrated circuit defined in claim 11, wherein the body bias control circuitry comprises a multiplexer having a multiplexer output that is operable to supply a forward body bias voltage to the body terminal of the address transistor and a reverse body bias voltage to the body terminal of at least one of the transistors in the second inverter.

13. A method for performing read and write operations on a set of memory elements in an integrated circuit, comprising:

during a write operation, using body bias control circuitry to adjust memory element transistors in the memory elements to write strength settings; and during a read operation, using the body bias control circuitry to adjust the memory element transistors in the memory elements to read strength settings, wherein the read strength settings are different from the write strength settings, wherein adjusting the memory element transistors to the write strength settings comprises weakening an n-channel metal-oxide-semiconductor transistor in cross-coupled inverters in the memory element.

14. The method defined in claim 13, wherein adjusting the memory element to the write strength settings comprises strengthening an address transistor in each memory element that is connected to cross-coupled inverters in that memory element.

15. A method for supplying body bias voltages to memory element transistors on an integrated circuit, wherein the memory elements transistors have associated speeds, comprising:

with test equipment, characterizing the associated speeds of memory element transistors on the integrated circuit to identify slow memory element transistors; and during operation of the integrated circuit, supplying compensating body bias voltages to the slow memory element transistors to strengthen the slow memory element transistors, wherein the integrated circuit comprises a memory cell formed from cross-coupled inverters that include an re-channel metal-oxide semiconductor transistor; and during write operations into the memory cell, weakening the n-channel metal-oxide semiconductor transistor.

16. The method defined in claim 15 wherein characterizing the speed of the memory element transistors comprises identifying fast memory element transistors, the method further comprising supplying compensating body bias voltages to the fast memory element transistors to weaken the fast memory element transistors.

* * * * *